(12) United States Patent
Erdoel et al.

(10) Patent No.: US 11,824,019 B2
(45) Date of Patent: Nov. 21, 2023

(54) CHIP PACKAGE WITH SUBSTRATE INTEGRATED WAVEGUIDE AND WAVEGUIDE INTERFACE

(71) Applicant: Infineon Technologies AG, Neubiberg (DE)

(72) Inventors: Tuncay Erdoel, Unterhaching (DE); Walter Hartner, Bad Abbach-Peissing (DE); Ulrich Moeller, Holzkirchen (DE); Bernhard Rieder, Regensburg (DE); Ernst Seler, Munich (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 182 days.

(21) Appl. No.: 17/356,831

(22) Filed: Jun. 24, 2021

(65) Prior Publication Data

US 2022/0415830 A1 Dec. 29, 2022

(51) Int. Cl.

| | |
|---|---|
| *H01L 23/66* | (2006.01) |
| *H01L 23/31* | (2006.01) |
| *H01L 23/498* | (2006.01) |
| *H01Q 1/22* | (2006.01) |
| *H01P 3/12* | (2006.01) |
| *G01S 13/02* | (2006.01) |

(52) U.S. Cl.
CPC .......... *H01L 23/66* (2013.01); *H01L 23/3114* (2013.01); *H01L 23/49816* (2013.01); *H01L 23/49822* (2013.01); *H01P 3/121* (2013.01); *H01Q 1/2283* (2013.01); *G01S 13/02* (2013.01); *H01L 2223/6627* (2013.01); *H01L 2223/6677* (2013.01); *H01L 2223/6683* (2013.01)

(58) Field of Classification Search
None
See application file for complete search history.

(56) References Cited

U.S. PATENT DOCUMENTS

| | | | | |
|---|---|---|---|---|
| 2012/0256707 A1* | 10/2012 | Leiba | ...................... | H01P 3/121 216/13 |
| 2017/0048969 A1* | 2/2017 | Qiang | ...................... | H05K 1/09 |

* cited by examiner

*Primary Examiner* — Jay C Chang
(74) *Attorney, Agent, or Firm* — Harrity & Harrity, LLP

(57) ABSTRACT

A chip package includes a chip configured to generate and/or receive a signal; a laminate substrate including a substrate integrated waveguide (SIW) for carrying the signal, the substrate integrated waveguide including a chip-to-SIW transition structure configured to couple the signal between the SIW and the chip and a SIW-to-waveguide transition structure configured to couple the signal out of the SIW or into the SIW, wherein the SIW-to-waveguide transition structure includes a waveguide aperture; and a plurality of electrical interfaces arranged about a periphery of the waveguide aperture, the plurality of electrical interfaces configured to receive the signal from the SIW-to-waveguide transition structure and output the signal from the chip package or to couple the signal to the SIW-to-waveguide transition structure and into the chip package.

24 Claims, 10 Drawing Sheets

CHIP PACKAGE WITH SUBSTRATE INTEGRATED WAVEGUIDE AND WAVEGUIDE INTERFACE

BACKGROUND

In high-frequency applications, insertion loss is an important problem and metallic waveguides are often used for implementation of antennas and transmission of signals. The microwave frequency band (e.g., 300 MHz to 300 GHz), may be an example of a high-frequency application. For example, high-frequency signals may include radar signals or wireless communication signals.

In current applications, high-frequency signals are carried between a chip package and a metallic waveguide through a printed circuit board (PCB). This means that the high-frequency signals are carried between the chip package and the metallic waveguide in two steps. First, a high-frequency signal is transmitted from the chip package to transmission lines on the PCB. Second, PCB to waveguide transitions are used to transmit the high-frequency signal from the PCB to the waveguide. Transmission lines on the PCB have high insertion loss compared to the waveguide. For this reason, low-loss substrates utilizing high-performance materials suitable for high-frequency applications are used in PCB. These substrates increase the PCB cost substantially and, as a result, PCB cost becomes an important part of overall system cost.

Therefore, an improved chip package design that both reduces insertion losses and cost by eliminating the use of high-performance microwave materials in PCB may be desirable.

SUMMARY

One or more embodiments provide a chip package that includes a chip configured to generate and/or receive a signal; a laminate substrate including a substrate integrated waveguide (SIW) for carrying the signal through the chip package, the substrate integrated waveguide including a chip-to-SIW transition structure configured to couple the signal into the SIW from the chip and a SIW-to-waveguide transition structure configured to couple the signal out of the SIW, wherein the SIW-to-waveguide transition structure includes a waveguide aperture; and a plurality of electrical interfaces arranged about a periphery of the waveguide aperture, the plurality of electrical interfaces configured to receive the signal from the SIW-to-waveguide transition structure and output the signal from the chip package.

One or more embodiments provide a signal transmission system, including: a chip package and a metallic waveguide. The chip package includes a chip configured to generate and/or receive a signal; a laminate substrate including a substrate integrated waveguide (SIW) for carrying the signal through the chip package, the substrate integrated waveguide including a chip-to-SIW transition structure configured to couple the signal into the SIW from the chip and a SIW-to-waveguide transition structure configured to couple the signal out of the SIW, wherein the SIW-to-waveguide transition structure includes a waveguide aperture; and a plurality of electrical interfaces arranged about a periphery of the waveguide aperture, the plurality of electrical interfaces configured to receive the signal from the SIW-to-waveguide transition structure and output the signal from the chip package. The metallic waveguide is electrically coupled to the plurality of electrical interfaces, wherein the metallic waveguide is configured to receive the signal output from the chip package via the plurality of electrical interfaces and transmit the signal along a propagation path.

One or more embodiments provide a chip package that includes a chip configured to receive and process a signal; a laminate substrate including a substrate integrated waveguide (SIW) for carrying the signal through the chip package, the substrate integrated waveguide including a waveguide-to-SIW transition structure configured to couple the signal into the substrate integrated waveguide from a waveguide and a SIW-to-chip transition structure configured to couple the signal out of the substrate integrated waveguide into the chip, wherein the waveguide-to-SIW transition structure includes a waveguide aperture; and a plurality of electrical interfaces arranged about a periphery of the waveguide aperture, the plurality of electrical interfaces configured to receive the signal from the waveguide and couple the signal to the waveguide-to-SIW transition structure and into the substrate integrated waveguide.

BRIEF DESCRIPTION OF THE DRAWINGS

Embodiments are described herein making reference to the appended drawings.

DETAILED DESCRIPTION

Figure 1A:
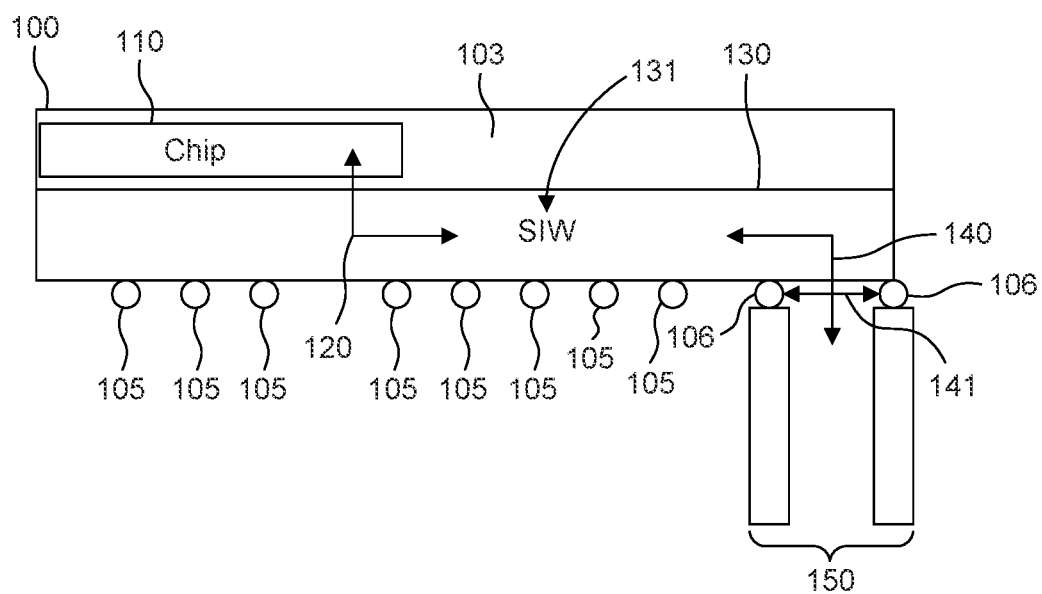
FIG. 1A shows a cross-sectional diagram of a chip package and a metallic waveguide used for signal transmission according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation. For example, lateral, vertical, and overlapping spatial or positional relationships may be described in reference to another element or feature, without being limited to a specific orientation of the device as a whole.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more embodiments relate to a chip package used in high-frequency applications that transmit high-frequency signals to a metallic waveguide used for the implementation of antennas and transmission of the high-frequency signals. Here, transmitting high-frequency signals from the chip package to a metallic waveguide is done without the use of high-performance microwave materials, particularly in a printed circuit board (PCB) or other RF circuit board/substrate between the chip package and the metallic waveguide.

The microwave frequency band (e.g., 300 MHz to 300 GHz), and specifically those used for radar signals or wireless communication signals, may be one example of a high-frequency application. The chip package, while not limited thereto, may be a radar chip package that houses a radar monolithic microwave integrated circuit (MIMIC) as the chip. It will also be appreciated that the high-frequency signals may be other types of radio frequency (RF) signals not limited to radar. For example, a chip may be an RF communications chip that generates RF communication signals, such as those used in 5G, 6G, or other communication protocols. In either case, the chip package outputs high-frequency signals to a metallic waveguide. In other words, the metallic waveguide, located external to the chip package, is electrically coupled to the chip and receives high-frequency signals therefrom. The metallic waveguide may also be a PCB waveguide and/or an antenna waveguide that transmits (emits) the high-frequency signal as a wireless signal.

Figure 1B:
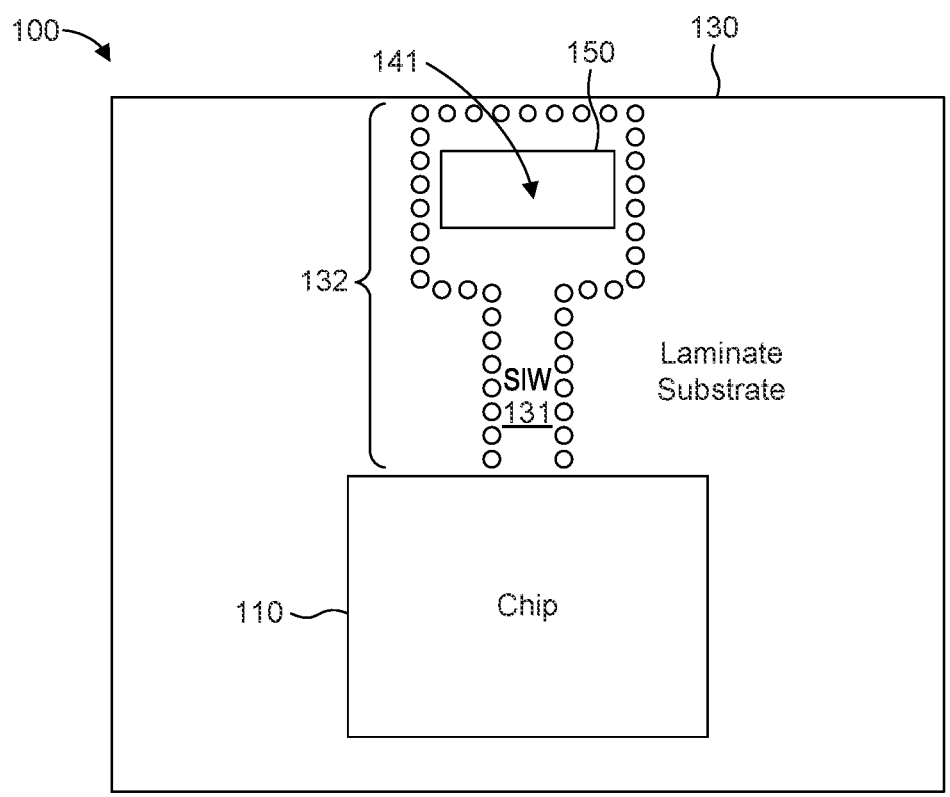
FIG. 1B shows a plan view of the chip package and the metallic waveguide according to FIG. 1A.

FIG. 1A shows a cross-sectional diagram of a chip package 100 and a metallic waveguide 150 used for signal transmission according to one or more embodiments. FIG. 1B shows a plan view of the chip package 100 and the metallic waveguide 150 according to FIG. 1A. The metallic waveguide 150 may be an antenna or part thereof that receives a high-frequency signal from the chip package 100 and transmits the signal into free space.

In this example, the chip package 100 is a Flip Chip Ball Grid Array (FCBGA) package that includes a semiconductor chip 110 configured to generate and/or receive high-frequency signals, a laminate substrate 130, a housing 103 (e.g., molding) that encapsulates the chip 110 and at least a portion of the laminate substrate 130, and electrical interfaces 105, such as solder balls or bumps, that provide electrical connections to the chip 110. Additional electrical interfaces 106 are provided as a subset of solder balls that are electrically coupled to and between the laminate substrate 130 and the waveguide (WG) 150. In particular, the laminate substrate 130 includes a substrate integrated waveguide (SIW) 131 that extends between two transitions 120 and 140. Thus, the two transitions 120 and 140 are incorporated in the chip package 100. Electrical interfaces 106 provide an electrical path for the high-frequency signal to be output from the chip package 100 to be transmitted to the waveguide 150.

Additionally, or alternatively, the electrical interfaces 106 provide an electrical path for the high-frequency signal to be input (i.e., coupled into) the chip package 100 from a metallic waveguide. For example, a radar MIMIC or a communications chip may have both transmit channels and receive channels. The transmit channels are connected to a transmit antenna (e.g., a metallic waveguide operable to transmit signals) and the receive channels are connected to a receive antenna (e.g., a metallic waveguide operable to receive signals). One antenna may be used for both transmission and reception by use of a multiplexing technique. Thus, the chip package 100 may have both transmit ports to transmit a signal generated in the chip 110 and receive ports to sense a signal intercepted by an antennas that is then transmitting to the chip 110 for processing.

In this case, the electrical path between the electrically interfaces 106 and the chip 110 is reversed in that an "output" described below may be referred to as an "input", an "input" described below may be referred to as an "output", "coupled in" may be reversed to mean "coupled out", and "coupled out" may be reversed to mean "coupled in" according to the propagation direction of a high-frequency signal through the chip package 100. The propagation direction of a high-frequency signal through the chip package 100 can be reversed in any of the embodiments described herein. Furthermore, while signals are referred to as "high-frequency", it will be appreciated that other signals that are not high-frequency may also be transmitted through the substrate integrated waveguide 131 in a similar manner to the high-frequency signals described herein. The substrate integrated waveguide 131 has a cut-off frequency. Thus, a limitation on frequency is for a signal to have a frequency equal to or greater than the cut-off frequency of the substrate integrated waveguide 131.

The substrate integrated waveguide 131 is formed in a dielectric substrate by densely arraying metallized posts or via-holes which connect the upper and lower metal plates of the substrate. The substrate integrated waveguide 131 is composed of a thin dielectric substrate covered on both faces by a metallic layer. The dielectric substrate embeds two parallel rows of metallic via-holes delimiting the wave propagation area of the high-frequency signal. The width of the substrate integrated waveguide 131 is the distance between its two vias rows, which is defined from center-to-center. An effective width may be used to characterize the wave propagation from an input to an output of the substrate integrated waveguide.

The input of the substrate integrated waveguide 131 is characterized by a chip-to-SIW transition 120. The input of the substrate integrated waveguide is coupled to the chip 110 via a solder ball or other electrical interface and receives the high-frequency signal output by the chip 110. The chip-to-SIW transition 120 may also provide one or more ground connections to the chip 110.

The high-frequency signal received at the input of the substrate integrated waveguide at the chip-to-SIW transition 120 propagates through the substrate integrated waveguide to an output of the substrate integrated waveguide characterized by a SIW-to-WG transition 140. The SIW-to-WG transition 140 includes electrical interfaces 106 (i.e., a subset of electrical interfaces 105) that are not only electrically coupled to the waveguide 150 but also form a perimeter around the waveguide 150 that defines a waveguide aperture 141. The waveguide aperture (WGA) 141 is an opening formed in the substrate integrated waveguide 131 and by the electrical interfaces 106. The high-frequency signal propagates through the substrate integrated waveguide and leaves the chip package 100 by way of the waveguide aperture 141. The electrical interfaces 106 are used as part of the output of the chip package 100 where the high-frequency signals propagate from the chip package 100 to the waveguide 150. Thus, the signal is transmitted from chip 110 to the waveguide aperture 141 of the package 100 through the substrate integrated waveguide 131.

If receiving the signal from the waveguide 150 (i.e., if the propagation direction of the high-frequency signal is reversed such that the chip is receiving the signal), the chip-to-SIW transition 120 may serve as a SIW-to-chip transition and the SIW-to-WG transition 140 may serve as a WG-to-SIW transition. The propagation path of the high-frequency signals through the chip package 100 may be bi-directional based on the application.

As can be seen in FIG. 1B, the substrate integrated waveguide 131 is defined by a plurality of metal vias 132. The vias 132 are formed in two parallel rows that extend from the chip 110 (i.e., from the chip-to-SIW transition 120) towards the waveguide 150 (i.e., towards the SIW-to-WG transition 140). The two rows meet at the SIW-to-WG transition 140 to encircle the waveguide 150.

Figure 2A:
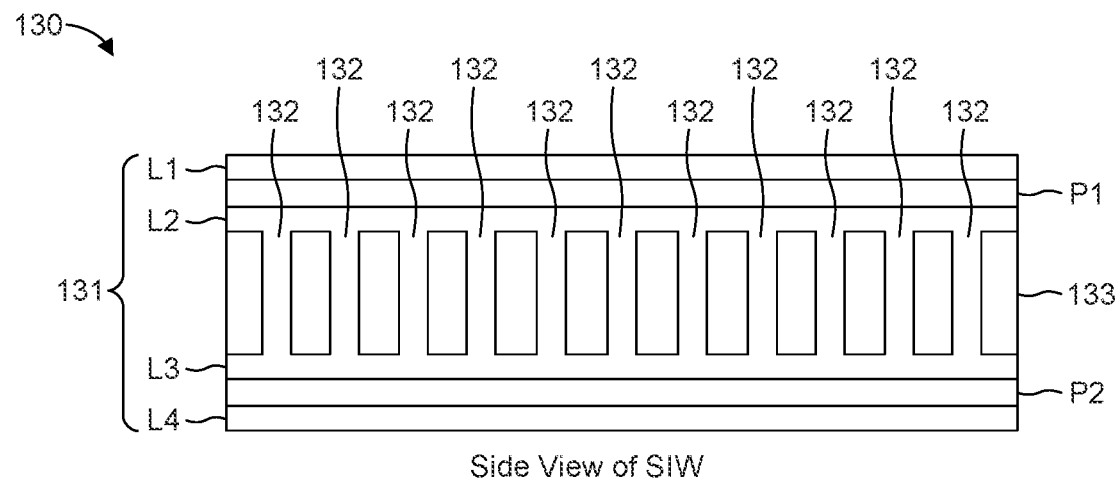
FIGS. 2A-2E are different views of a laminate substrate including a substrate integrated waveguide according to one or more embodiments.
Figure 2B:
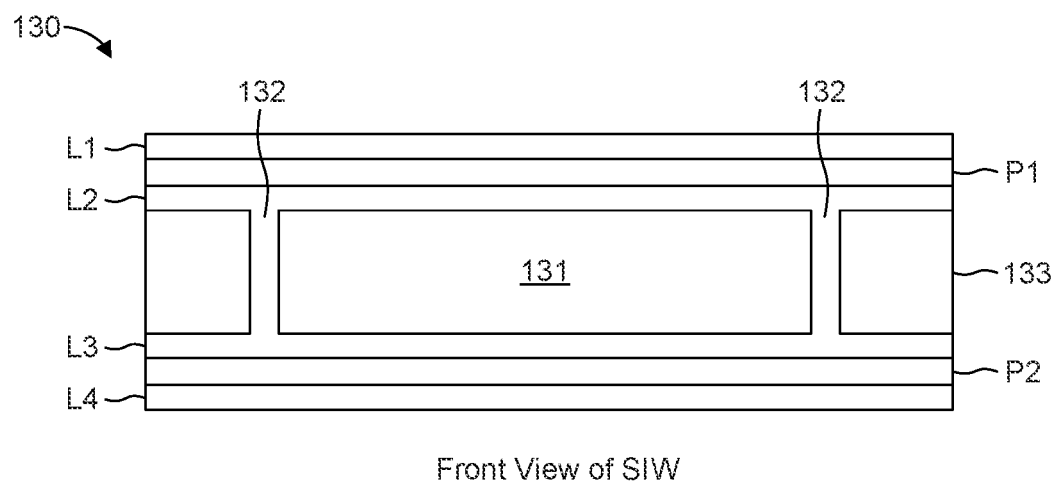
Figure 2C:
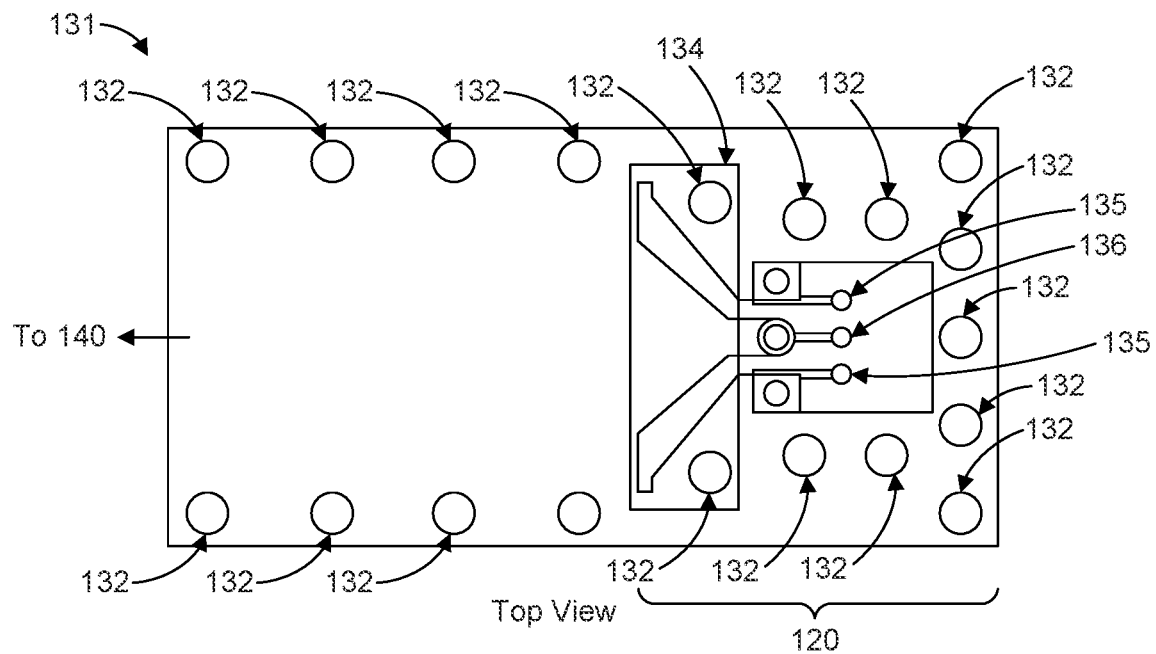
Figure 2D:
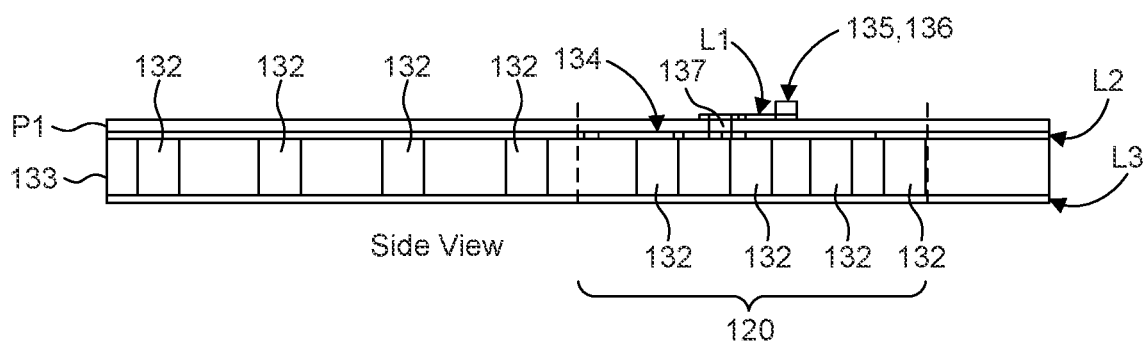
Figure 2E:
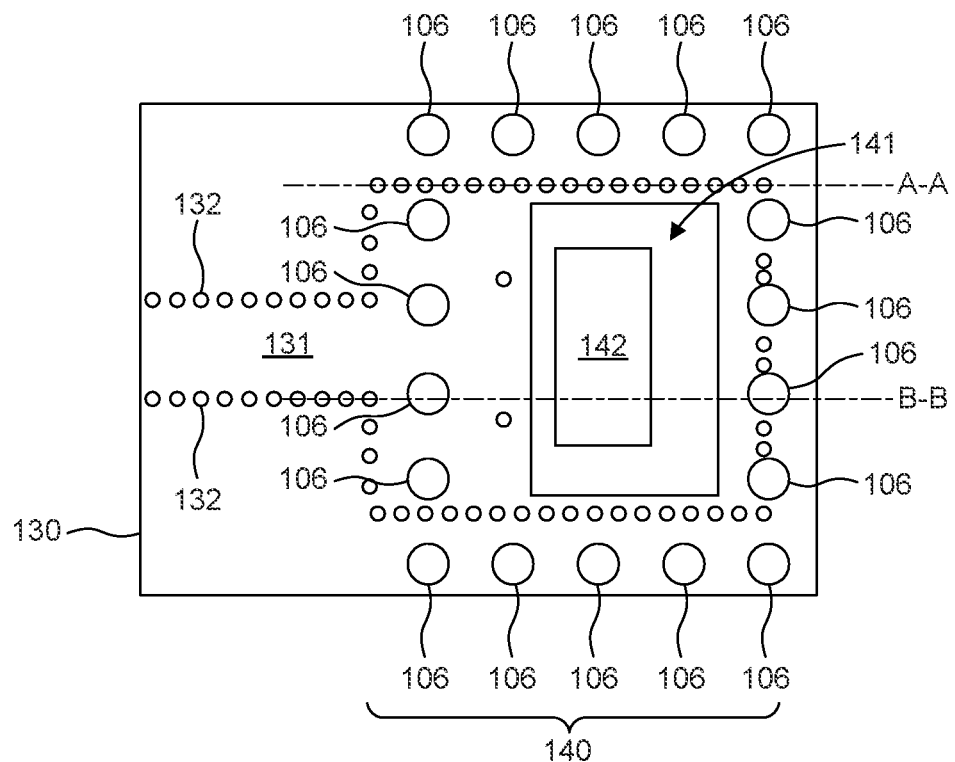

FIGS. 2A-2E are different views of the laminate substrate 130 including the substrate integrated waveguide 131 according to one or more embodiments. FIG. 2A is a side cross-sectional view of the laminate substrate 130 including the substrate integrated waveguide 131. FIG. 2B is a front cross-sectional view of the laminate substrate 130 including the substrate integrated waveguide 131. FIG. 2C is a plan view of the laminate substrate 130 at the chip-to-SIW transition 120 of the substrate integrated waveguide 131. FIG. 2D is a side cross-sectional view of the laminate substrate 130 at the chip-to-SIW transition 120 of the substrate integrated waveguide 131. FIG. 2E is a plan view of the laminate substrate 130 at the SIW-to-WG transition 140 of the substrate integrated waveguide 131.

The laminate substrate 130 includes a stack of metal layers L1, L2, L3 and L4 in laminate. A prepreg layer P1 (e.g., a dielectric material) is arranged between metal layers L1 and L2. A dielectric core 133 is a dielectric substrate arranged between metal layers L2 and L3. Another prepreg layer P2 is arranged between metal layers L3 and L4. The substrate integrated waveguide 131 is built between metal layers L2 and L3. It includes metal layer L2 as a top wall or a top metal plate, metal layer L3 as a bottom wall or a bottom metal plate, and vias 132 that extend through the dielectric core 133 from metal layer L2 to metal layer L3. Being a side view, one row of vias is shown in FIG. 2A. In FIG. 2B, two rows of vias 132 can be seen that form the lateral walls of the substrate integrated waveguide 131. Thus, the substrate integrated waveguide 131 is defined by the area formed by L2, L3 and the lateral walls of vias 132.

The chip-to-SIW transition 120 of the substrate integrated waveguide 131 is shown in FIG. 2C. The chip-to-SIW transition 120 is realized by a tapered coplanar waveguide 134 as an intermediate transmission structure for the high-frequency signals. Other types of intermediate transmission structures could also be used instead of a tapered coplanar waveguide. The chip-to-SIW transition 120 also includes chip RF ground line connections 135 that provide ground signals to the chip 110 and a chip RF signal line connection 136 that receives the high-frequency signals from the chip 110. The line connections 135 and 136 are solder balls or bumps, which can be seen in FIG. 2D. The tapered coplanar waveguide 134 receives the high-frequency signals from line connection 136 and transmits the high-frequency signals to the via rows such that they propagate along the via rows to the SIW-to-WG transition 140.

In FIG. 2D, line connections 135 and 136 are electrically coupled to metal layer L1 and line connection 136 is further electrically coupled to metal layer L2, and thus to the substrate integrated waveguide 131, by a metal via 137.

FIG. 2E is a plan view of the laminate substrate 130 at the SIW-to-WG transition 140 of the substrate integrated waveguide 131. The two rows of vias 132 encircle the waveguide aperture 141 that is formed in metal layers L3 and L4 of the laminate substrate 130 and is also defined by the periphery of the electrical interfaces (e.g., solder balls) 106. In other words, the waveguide aperture 141 is a cavity that starts at metal layer L3, extends through metal layer L4, extends between electrical interfaces 106, and further extends to the waveguide 150. The transmitted wave of the high-frequency signal propagates through the waveguide aperture 141 to the waveguide 150. Additionally, metal layer L3 may include a metal island 142 within the waveguide aperture 141. The metal island 142 may be used for impedance matching.

Figure 2F:
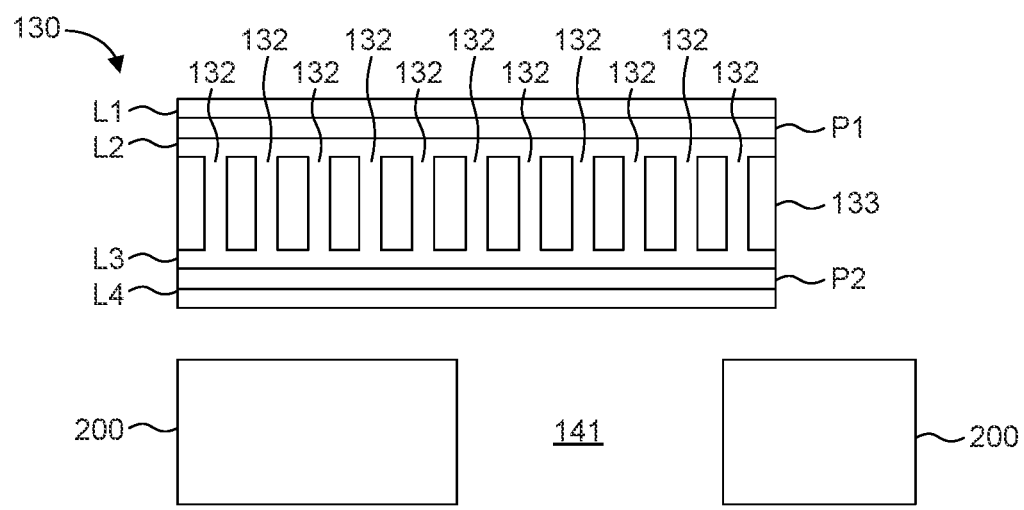
FIG. 2F illustrates a cross-sectional view of a SIW-to-WG transition of the substrate integrated waveguide taken at cut line A-A in FIG. 2E.
Figure 2G:
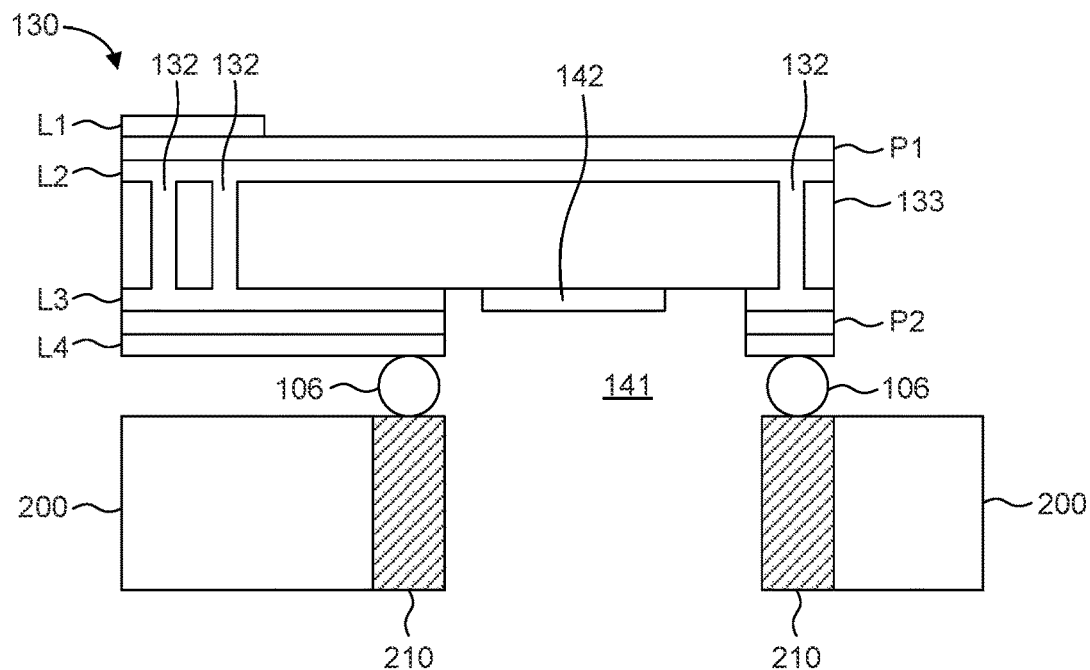
FIG. 2G illustrates a cross-sectional view of the SIW-to-WG transition of the substrate integrated waveguide taken at cut line B-B in FIG. 2E.

FIG. 2E shows two cut lines A-A and B-B illustrated in FIGS. 2F and 2G, respectively. Thus, FIG. 2F illustrates a cross-sectional view of the SIW-to-WG transition 140 of the substrate integrated waveguide 131 taken at cut line A-A and FIG. 2G illustrates a cross-sectional view of the SIW-to-WG transition 140 of the substrate integrated waveguide 131 taken at cut line B-B.

The stacked layers can again be seen in FIGS. 2F and 2G, with a row of vias 132 extending between metal layers L2 and L3 and forming the substrate integrated waveguide 131. A PCB 200 (e.g., an antenna PCB) is also shown that is to be electrically connected to the substrate integrated waveguide 131 via electrical interfaces 106. Specifically, waveguide aperture 141 may extend through a portion of the PCB 200, the interior sidewalls of which are lined (i.e., metal plated), with a PCB waveguide 210 used to carry the signals from the package to the waveguide 150 (not illustrated). The PCB waveguide 210 may be made of copper but is not limited thereto. The PCB waveguide 210 of the PCB 200 is coupled to electrical interfaces 106.

The waveguide aperture 141 is formed in metal layer L3, which also includes the metal island 142. The waveguide aperture 141 extends through metal layer L4, through an area defined by the periphery of the electrical interfaces 106, and through the PCB 200. Thus, the PCB 200 is an exterior transition from the chip package 100 to the metal waveguides 150 (i.e., antennas). The high-frequency signal is output from the substrate integrated waveguide 131 at the waveguide aperture 141 and is coupled into the waveguide 150 by the metal island 142, electrical interfaces 106, and the PCB waveguide 210. The metal island 142 in L3 layer radiates the signal into the electrical interfaces 106 and the PCB waveguide 210 and the dielectric layer P2 between metal layers L3 and L4 is very thin. If the dielectric layer P2 is thicker, metal vias connecting metal layers L3 and L4 proximate to the waveguide aperture 141 may be used to transmit the signal to the electrical interfaces 106 and out of the package (or to couple the signal into the substrate integrated waveguide 131 during reception). The waveguide aperture 141 inside the PCB 200 is a hole and no high-performance material is needed inside the PCB 200. Thus, the waveguide aperture 141 is a contiguous opening that starts at metal layer L3 of the substrate integrated waveguide 131 and extends through the PCB 200 and through the metal waveguides 150.

Figure 3A:
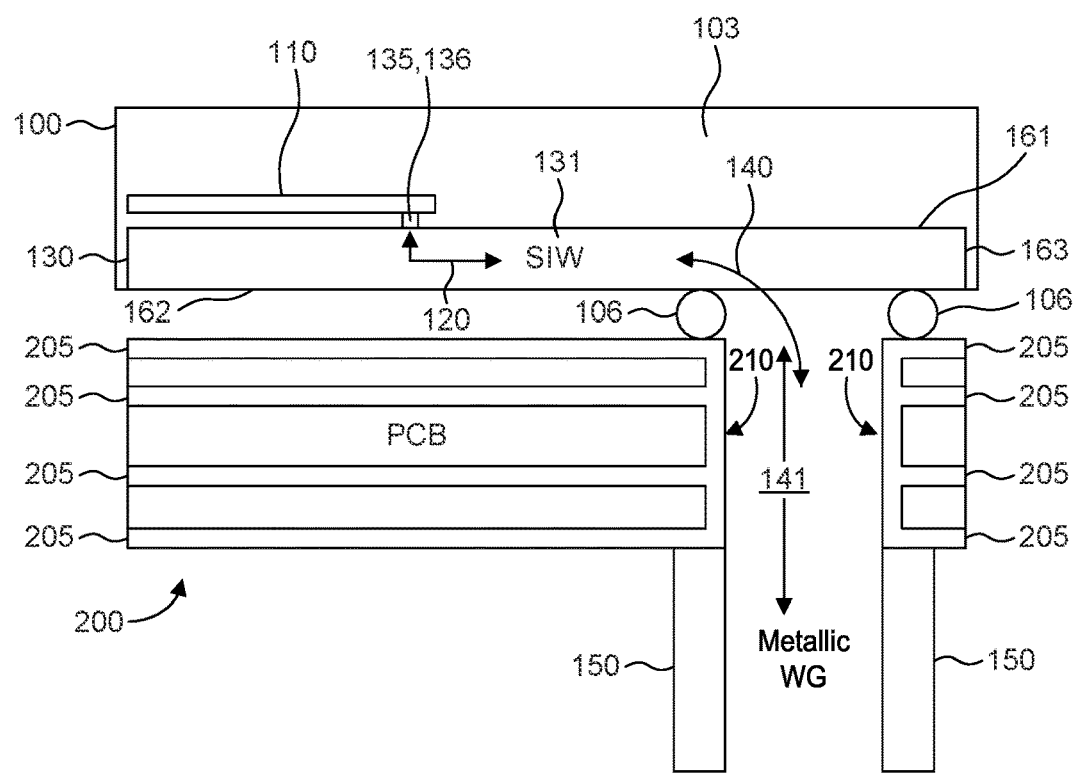
FIGS. 3A-3C are cross-sectional views of a chip package coupled to a metallic waveguide according to one or more embodiments where the location of the coupling is varied.
Figure 3B:
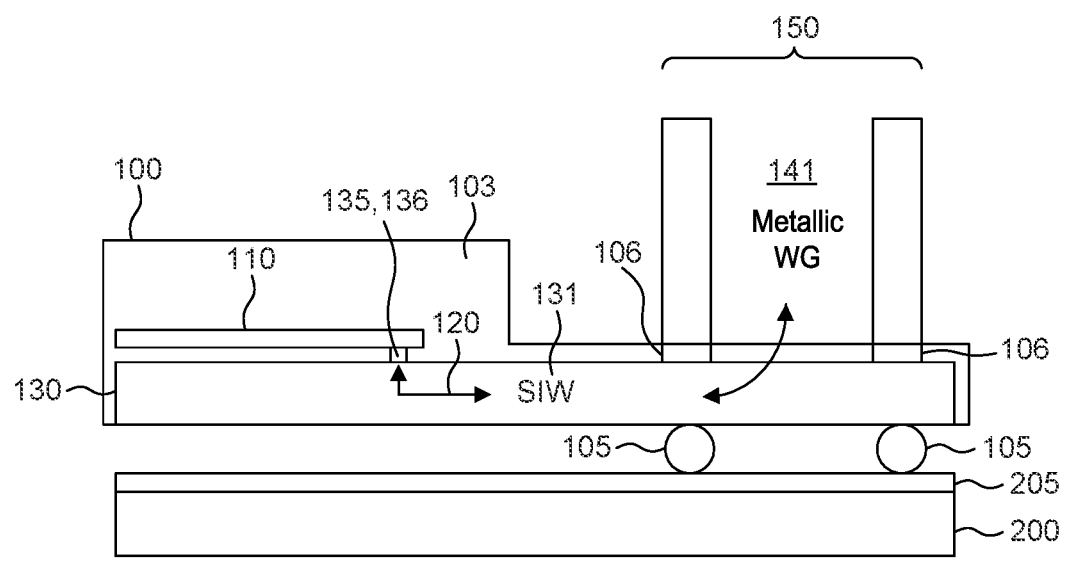
Figure 3C:
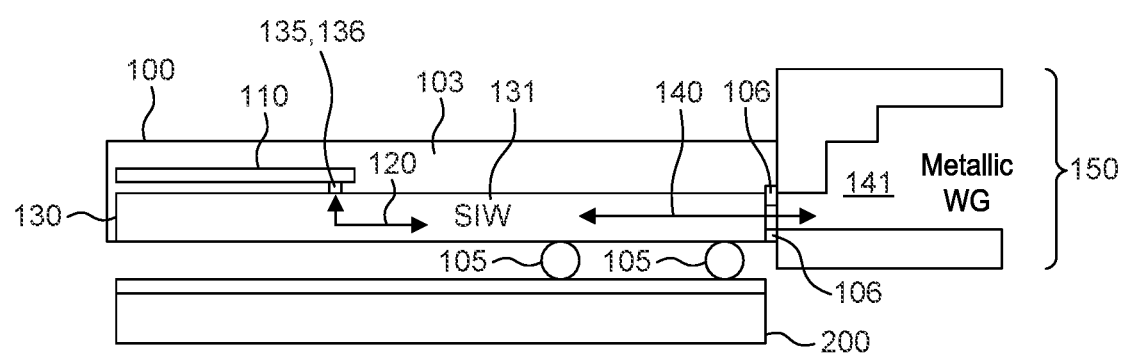

FIGS. 3A-3C are cross-sectional views of a chip package coupled to a metallic waveguide 150 according to one or more embodiments where the location of the coupling is varied. The laminate substrate 130 includes a backside 161, a frontside 162, and lateral sides 163 that extend between the backside and the frontside and placement of the chip 110, electrical interfaces 106, and the waveguides 210 and 150 are varied relative to the backside, the frontside, and the lateral sides of the laminate substrate 130.

In FIG. 3A, similar to the arrangement shown in FIG. 1A, the chip package 100 includes a chip 110 electrically coupled to the backside of the laminate substrate 130. A frontside of the laminate substrate 130 is electrically coupled, via electrical interfaces 106, to a PCB 200. The PCB 200 includes metal layers 205 that are connected to a PCB waveguide 210. The PCB waveguide 210 is a metal structure that lines sides of the waveguide aperture 141 and provides an electrical path from the electrical interfaces 106 to the metal waveguides 150 (i.e., antennas) for the high-frequency signals to propagate.

In FIG. 3B, the metal waveguide 150 is electrically coupled to the same side of the laminate substrate 130 as the chip 110 (i.e., the backside of the laminate substrate 130). In this case, the electrical interfaces 106 are also arranged at the backside of the laminate substrate 130. Since rigid contacting structures, such as solder balls, may not be possible in this location, the electrical interfaces 106 may be flexible contacting structures or rigid non-contacting structures.

In FIG. 3C, the metal waveguide 150 is electrically coupled to a lateral side of the laminate substrate 130 instead of the backside or the frontside. In this case, the electrical interfaces 106 are also arranged at the lateral side of the laminate substrate 130. Since rigid contacting structures, such as solder balls, may not be possible in this location, the electrical interfaces 106 may be flexible contacting structures or rigid non-contacting structures.

Figure 4A:
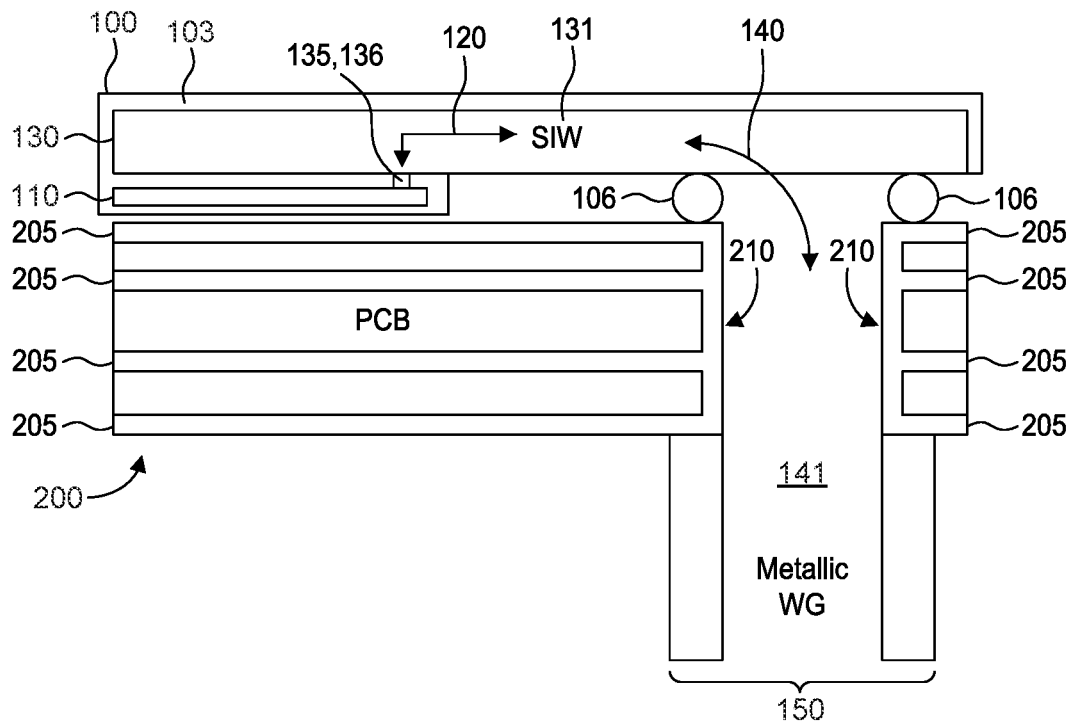
FIGS. 4A-4C are cross-sectional views of a chip package coupled to a metallic waveguide according to one or more embodiments where the location of the coupling is varied.
Figure 4B:
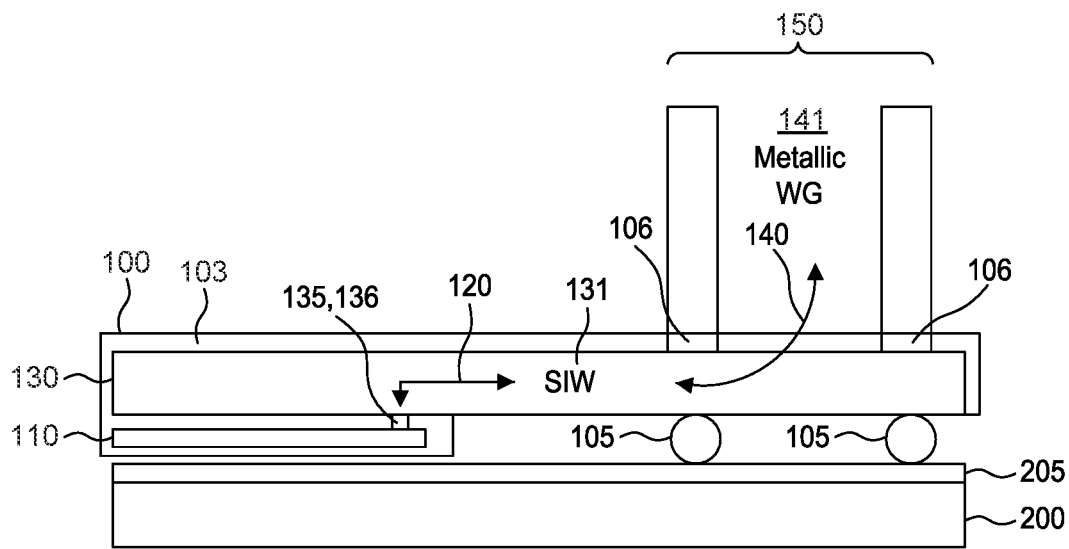
Figure 4C:
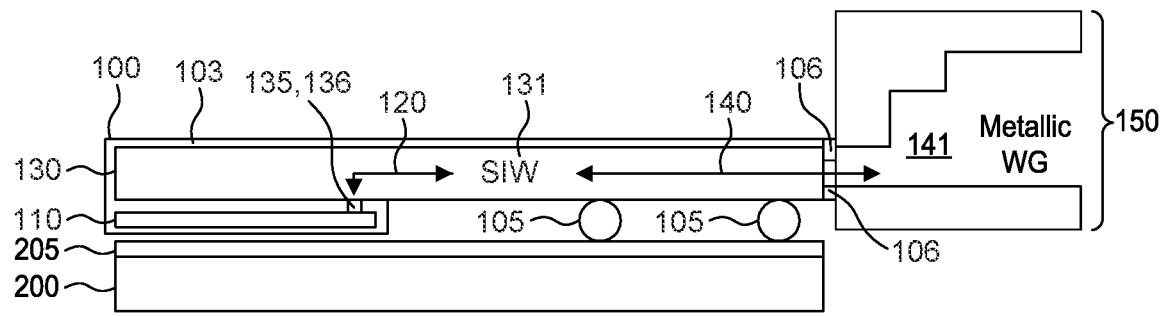

FIGS. 4A-4C are cross-sectional views of a chip package coupled to a metallic waveguide according to one or more embodiments where the location of the coupling is varied. In these figures, the chip 110 is electrically coupled to the frontside of the laminate substrate 130 instead of the backside, as was the case in FIGS. 3A-3C. The arrangement of the metal waveguide 150 with respect to the chip package 100 is similar to the arrangements presented for FIGS. 3A-3C.

Figure 5A:
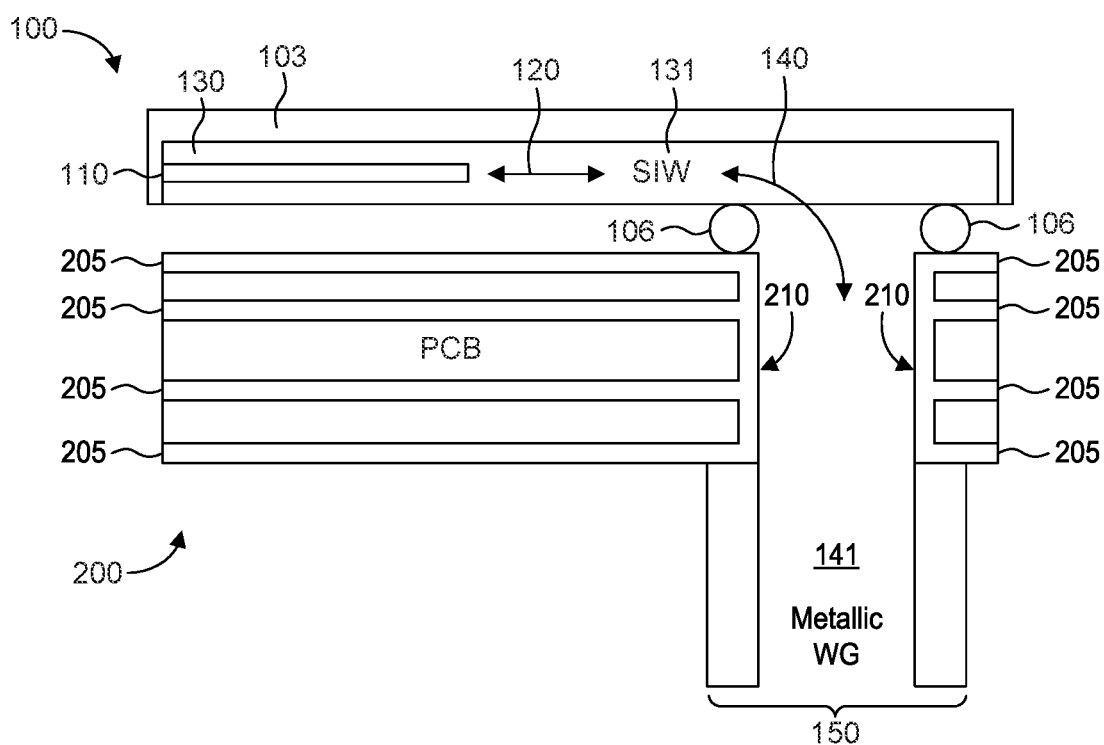
FIGS. 5A-5C are cross-sectional views of a chip package coupled to a metallic waveguide according to one or more embodiments where the location of the coupling is varied.
Figure 5B:
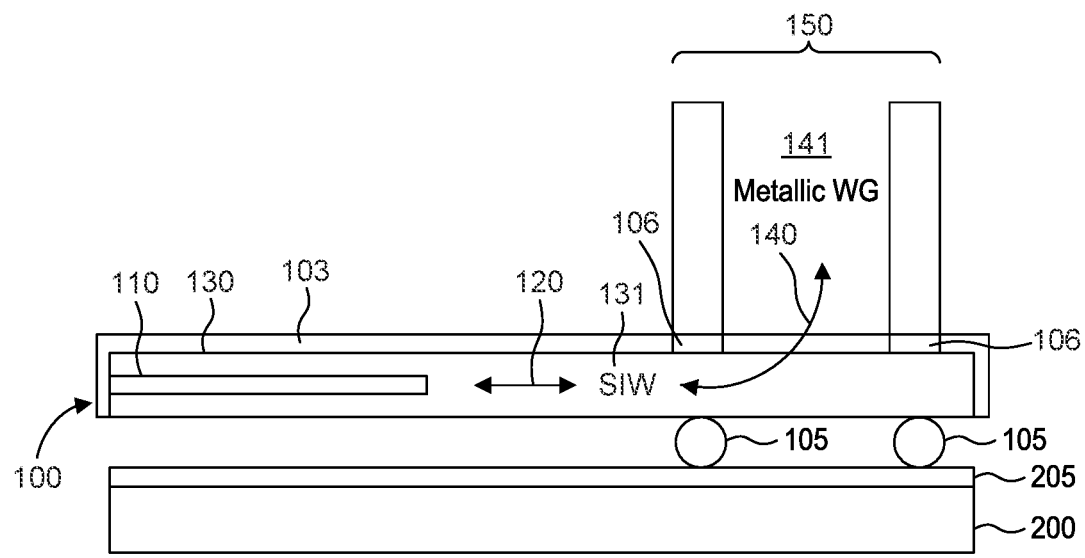
Figure 5C:
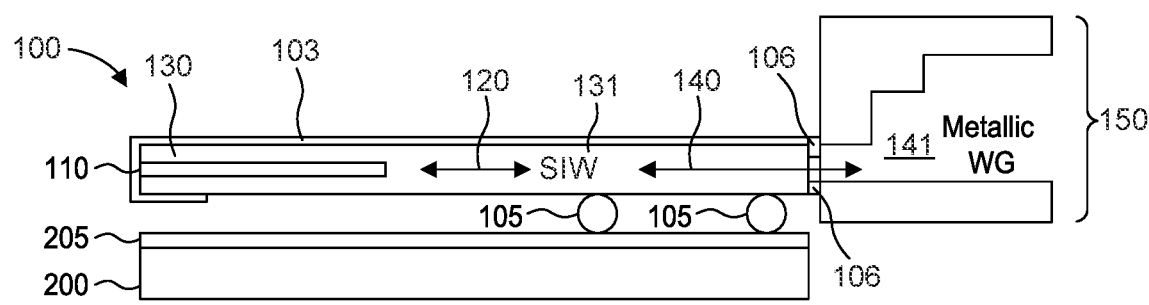

FIGS. 5A-5C are cross-sectional views of a chip package coupled to a metallic waveguide according to one or more embodiments where the location of the coupling is varied. In these figures, the chip 110 is integrated in the laminate substrate 130 instead of being coupled to the backside or to the frontside thereof, as was the case in FIGS. 3A-3C and FIGS. 4A-4C, respectively. The arrangement of the metal waveguide 150 with respect to the chip package 100 is similar to the arrangements presented for FIGS. 3A-3C.

Figure 6:
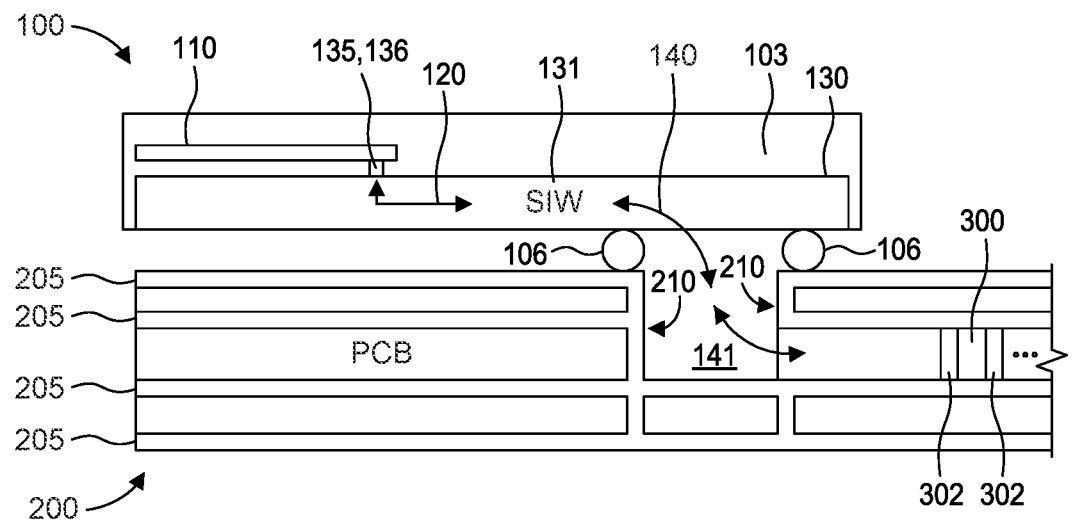
FIG. 6 is a cross-sectional view of a chip package coupled to a PCB according to one or more embodiments.

FIG. 6 is a cross-sectional view of a chip package coupled to a PCB according to one or more embodiments. The chip package 100 and its arrangement relative to the PCB 200 is similar to that shown in FIG. 3A. However, in this case, the PCB 200 includes an additional substrate integrated waveguide 300 integrated therein. In particular, the metal layers 205 of the PCB 200 are used in a similar manner shown in FIG. 2A to form the additional substrate integrated waveguide 300, with vias 302 extending between the two middle metal layers 205 (e.g., L2 and L3) to form the additional substrate integrated waveguide 300. The additional substrate integrated waveguide 300 receives the high-frequency signal from the PCB waveguide 210 and transmits the high-frequency signal along its propagation path to, for example, another device or metal waveguide. Thus, the PCB waveguide 210 is used to couple out the high-frequency signal from the substrate integrated waveguide 131 of the chip package 100 and couple the high-frequency signal into the additional substrate integrated waveguide 300.

Figure 7:
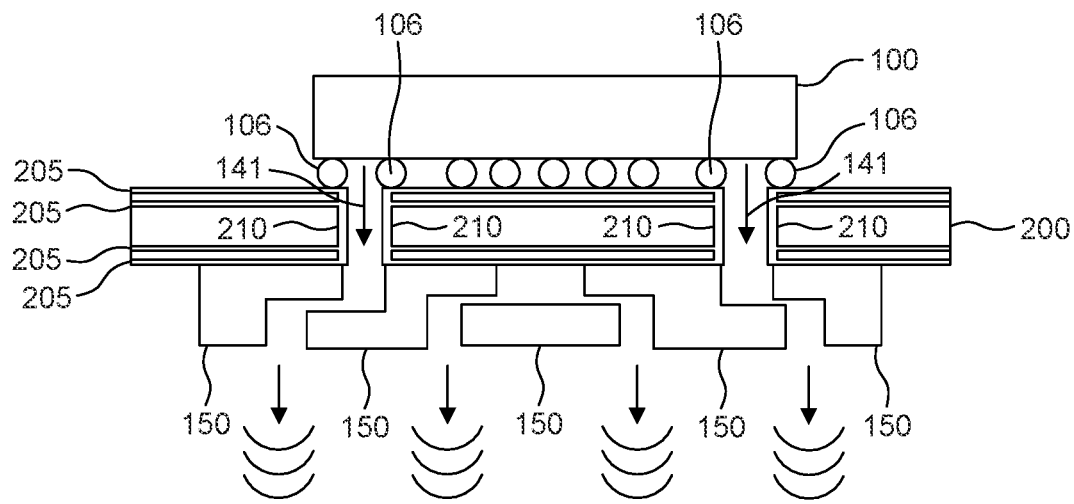
FIG. 7 is a cross-sectional view of a chip package coupled to an antenna PCB according to one or more embodiments.

FIG. 7 is a cross-sectional view of a chip package 100 coupled to an antenna PCB 200 according to one or more embodiments. The metal waveguides 150 are waveguide antennas for transmitting high-frequency signals into an environment (e.g., as radar waves, communication waves, or other RF waves). The high-frequency signals are output from the chip package 100 by its electrical interfaces 106 and the PCB waveguides 210 is used to distribute the high-frequency signals to the metal waveguides 150.

The foregoing embodiments that include integrating the SIW 131 and its transition structures 120 and 140 into the chip package 100 reduces system cost by eliminating high-performance materials from the PCB 200. In addition, with SIW, the chip package 100 is affected less from production tolerances. In addition, system performance is expected to be higher for systems that includes waveguides for signal transmission, since the overall insertion losses should decrease.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A chip package, comprising:
   a chip configured to generate a signal;
   a laminate substrate comprising a substrate integrated waveguide (SIW) for carrying the signal through the chip package, the SIW comprising:
      a chip-to-SIW transition structure configured to couple the signal into the SIW from the chip,
      a SIW-to-waveguide transition structure configured to couple the signal out of the SIW, wherein the SIW-to-waveguide transition structure comprises a waveguide aperture,
      a first metal layer that extends in a signal propagation direction from the chip-to-SIW transition structure to the SIW-to-waveguide transition structure,
      a second metal layer that extends parallel to the first metal layer, and
      two rows of vias that extend in the signal propagation direction and encircle the waveguide aperture, wherein each via of the two rows of vias is connected to the first metal layer and the second metal layer; and
   a plurality of electrical interfaces arranged about a periphery of the waveguide aperture, the plurality of electrical interfaces configured to receive the signal from the SIW-to-waveguide transition structure and output the signal from the chip package.

2. The chip package of claim 1, wherein at least one of:
   the waveguide aperture extends from the SIW-to-waveguide transition structure though an area defined by the plurality of electrical interfaces, or
   the chip is a radar monolithic microwave integrated circuit (MIMIC) and the signal is a radar signal.

3. The chip package of claim 1, wherein chip is a radio frequency (RF) communications chip and the signal is an RF communication signal.

4. The chip package of claim 1, wherein the plurality of electrical interfaces are solder balls.

5. The chip package of claim 1, wherein:
   the laminate substrate comprises a backside, a frontside, and lateral sides that extend between the backside and the frontside,
   the chip is arranged on the backside of the laminate substrate, and
   the plurality of electrical interfaces are arranged on the frontside of the laminate substrate.

6. The chip package of claim 1, wherein:
   the laminate substrate comprises a backside, a frontside, and lateral sides that extend between the backside and the frontside, and
   the chip and the plurality of electrical interfaces are arranged on the frontside of the laminate substrate.

7. The chip package of claim 1, wherein:
   the laminate substrate comprises a backside, a frontside, and lateral sides that extend between the backside and the frontside,
   the chip is arranged on the backside or on the frontside of the laminate substrate, and
   the plurality of electrical interfaces are arranged on a lateral side of the laminate substrate.

8. The chip package of claim 1, wherein:
the laminate substrate comprises a backside, a frontside, and lateral sides that extend between the backside and the frontside,
the chip is integrated in the laminate substrate, and
the plurality of electrical interfaces are arranged on the frontside of the laminate substrate, on the backside of the laminate substrate, or on a lateral side of the laminate substrate.

9. The chip package of claim 1, further comprising:
a housing that encapsulates the chip and at least a portion of the laminate substrate.

10. A signal transmission system, comprising:
a chip package comprising:
  a chip configured to generate or receive a signal;
  a laminate substrate comprising a substrate integrated waveguide (SIW) for carrying the signal through the chip package, the SIW comprising:
    a chip-to-SIW transition structure configured to couple the signal between the SIW and the chip,
    a SIW-to-waveguide transition structure configured to couple the signal out of the SIW or into the SIW, wherein the SIW-to-waveguide transition structure comprises a waveguide aperture,
    a first metal layer that extends in a signal propagation direction from the chip-to-SIW transition structure to the SIW-to-waveguide transition structure,
    a second metal layer that extends parallel to the first metal layer, and
    two rows of vias that extend in the signal propagation direction and encircle the waveguide aperture, wherein each via of the two rows of vias is connected to the first metal layer and the second metal layer; and
  a plurality of electrical interfaces arranged about a periphery of the waveguide aperture, the plurality of electrical interfaces configured to receive the signal from the SIW-to-waveguide transition structure and output the signal from the chip package or to couple the signal to the SIW-to-waveguide transition structure and into the substrate integrated waveguide; and
a first metallic waveguide electrically coupled to the plurality of electrical interfaces, wherein the first metallic waveguide is configured to receive the signal output from the chip package via the plurality of electrical interfaces and transmit the signal along a propagation path or transmit the signal to the chip package via the plurality of electrical interfaces.

11. The signal transmission system of claim 10, wherein the first metallic waveguide includes a first opening as an extension of the waveguide aperture.

12. The signal transmission system of claim 11, wherein the first metallic waveguide is an antenna waveguide.

13. The signal transmission system of claim 11, further comprising:
a circuit substrate comprising the first metallic waveguide, wherein the first opening extends through at least a portion of the circuit substrate and the first metallic waveguide lines interior sidewalls of the circuit substrate that define the first opening.

14. The signal transmission system of claim 13, wherein the circuit substrate further comprises a second SIW electrically coupled to the first metallic waveguide for receiving the signal therefrom.

15. The signal transmission system of claim 11, further comprising:
a second metallic waveguide electrically coupled to the first metallic waveguide for receiving the signal therefrom,
wherein the first metallic waveguide is interposed between the plurality of electrical interfaces and the second metallic waveguide, and
wherein the second metallic waveguide includes a second opening as an extension of the waveguide aperture.

16. The signal transmission system of claim 15, further comprising:
a circuit substrate comprising the first metallic waveguide, wherein the first opening extends through at least a portion of the circuit substrate and the first metallic waveguide lines interior sidewalls of the circuit substrate that define the first opening, and
wherein the second metallic waveguide is an antenna waveguide.

17. The signal transmission system of claim 11, wherein:
the laminate substrate comprises a backside, a frontside, and lateral sides that extend between the backside and the frontside,
the chip is arranged on the backside of the laminate substrate, and
the plurality of electrical interfaces are arranged on the frontside of the laminate substrate.

18. The signal transmission system of claim 11, wherein:
the laminate substrate comprises a backside, a frontside, and lateral sides that extend between the backside and the frontside, and
the chip and the plurality of electrical interfaces are arranged on the frontside of the laminate substrate.

19. The signal transmission system of claim 11, wherein:
the laminate substrate comprises a backside, a frontside, and lateral sides that extend between the backside and the frontside,
the chip is arranged on the backside or on the frontside of the laminate substrate, and
the plurality of electrical interfaces are arranged on a lateral side of the laminate substrate.

20. The signal transmission system of claim 11, wherein:
the laminate substrate comprises a backside, a frontside, and lateral sides that extend between the backside and the frontside,
the chip is integrated in the laminate substrate, and
the plurality of electrical interfaces are arranged on the frontside of the laminate substrate, on the backside of the laminate substrate, or on a lateral side of the laminate substrate.

21. A chip package, comprising:
a chip configured to receive and process a signal;
a laminate substrate comprising a substrate integrated waveguide (SIW) for carrying the signal through the chip package, the SIW comprising:
  a waveguide-to-SIW transition structure configured to couple the signal into the substrate integrated waveguide from a waveguide,
  a SIW-to-chip transition structure configured to couple the signal out of the substrate integrated waveguide into the chip, wherein the waveguide-to-SIW transition structure comprises a waveguide aperture,
  a first metal layer that extends in a signal propagation direction from the waveguide-to-SIW transition structure to the SIW-to-chip transition structure,
  a second metal layer that extends parallel to the first metal layer, and two rows of vias that extend in the signal propagation direction and encircle the waveguide aperture, wherein each via of the two rows of vias is connected to the first metal layer and the second metal layer; and a plurality of electrical interfaces arranged about a periphery of the waveguide aperture, the plurality of electrical interfaces configured to receive the signal from the waveguide and couple the signal to the waveguide-to-SIW transition structure and into the substrate integrated waveguide.

22. The chip package of claim 21, wherein the waveguide aperture extends from the waveguide-to-SIW transition structure though an area defined by the plurality of electrical interfaces.

23. The chip package of claim 21, wherein chip is a radio frequency (RF) communications chip and the signal is an RF communication signal.

24. The chip package of claim 21, wherein:

the laminate substrate comprises a backside, a frontside, and lateral sides that extend between the backside and the frontside, the chip is arranged on the backside of the laminate substrate, and the plurality of electrical interfaces are arranged on the frontside of the laminate substrate.

* * * * *